(12) United States Patent
Kao et al.

(10) Patent No.: US 6,500,765 B2
(45) Date of Patent: Dec. 31, 2002

(54) METHOD FOR MANUFACTURING DUAL-SPACER STRUCTURE

(75) Inventors: Chia-Hung Kao, Tainan (TW); Alan Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/815,862

(22) Filed: Mar. 23, 2001

(65) Prior Publication Data

US 2002/0137341 A1 Sep. 26, 2002

(51) Int. Cl.$^7$ ............................................... H01L 21/03
(52) U.S. Cl. ........................................ 438/694; 438/696
(58) Field of Search ................................. 438/230, 231, 438/232, 303, 305, 306, 689, 694, 696, 697

(56) References Cited

U.S. PATENT DOCUMENTS

| | | | | |
|---|---|---|---|---|
| 4,775,642 A | * | 10/1988 | Chang et al. ............... | 257/315 |
| 5,162,884 A | * | 11/1992 | Liou et al. .................. | 257/344 |
| 5,212,542 A | * | 5/1993 | Okumura .................... | 257/328 |
| 5,672,531 A | * | 9/1997 | Gardner et al. ............. | 438/286 |
| 5,866,460 A | * | 2/1999 | Akram et al. ............... | 438/163 |

* cited by examiner

Primary Examiner—Gregory Mills
Assistant Examiner—Kin-Chan Chen
(74) Attorney, Agent, or Firm—J.C. Patents

(57) ABSTRACT

A method of manufacturing a field effect transistor with a dual-spacer structure. A substrate having a first device region and a second device region is provided. The first device region comprises a first gate formed over the substrate and the second device region comprises a second gate formed over the substrate. A first dielectric layer is formed over the substrate. A second dielectric layer is formed on the first dielectric layer. A portion of the second dielectric layer is removed to expose a portion of the first dielectric layer in the second device region. A portion of the remaining second dielectric layer is removed to form a first spacer on the second dielectric layer on the sidewall of the first gate. A portion of the first dielectric layer is removed to form a second spacer on the sidewall of the second gate. The first spacer and the remaining second dielectric layer between the first spacer and the first gate together form a third spacer.

16 Claims, 2 Drawing Sheets

METHOD FOR MANUFACTURING DUAL-SPACER STRUCTURE

BACKGROUND OF THE INVENTION

1. Field of Invention

The present invention relates to a method for manufacturing a field effect transistor (FET). More particularly, the present invention relates to a method for manufacturing a FET with a dual-spacer structure.

2. Description of Related Art

When the integration of the device is increased, the energy consumption of the NMOS becomes a main problem in producing and designing integrated circuit by using NMOS as a basic element. Therefore, the COMS with a low-energy-consumption advantage is used to replace NMOS and to be a main element in manufacturing the devices.

However, because different type dopants with different diffusion rate, such as the diffusion rate of the P-type dopants is faster than that of the N-type dopants, the dopant diffusion in each source/drain region is uneven at the annual step in the formation of the source/drain region in the coexist P-type FET and N-type FET. Since the dopant diffusion of each source/drain region result is unequal, the short channel effect happens in the P-type FET when the source/drain region in N-type FET is not yet formed.

In order to improve the unequal diffusion rate mentioned above, different types of dopants with different dosage are used in the implantation process to adjust the diffusion rate of different types of dopants. Nevertheless, it is difficult to accurately control this diffusion-rate adjustment so that the shape of the source/drain region cannot be well controlled.

SUMMARY OF THE INVENTION

The invention provides a method of manufacturing a field effect transistor with a dual-spacer structure. A substrate having a first device region and a second device region is provided. The first device region comprises a first gate formed over the substrate and the second device region comprises a second gate formed over the substrate. A first dielectric layer is formed over the substrate. A second dielectric layer is formed on the first dielectric layer. A portion of the second dielectric layer is removed to expose a portion of the first dielectric layer in the second device region. A portion of the remaining second dielectric layer is removed to form a first spacer on the second dielectric layer on the sidewall of the first gate. A portion of the first dielectric layer is removed to form a second spacer on the sidewall of the second gate. The first spacer and the remaining second dielectric layer between the first spacer and the first gate together form a third spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1 through 5 are schematic, cross-sectional views of the process for manufacturing a FET with a dual-spacer structure in a preferred embodiment according to the invention.

Figure 1:
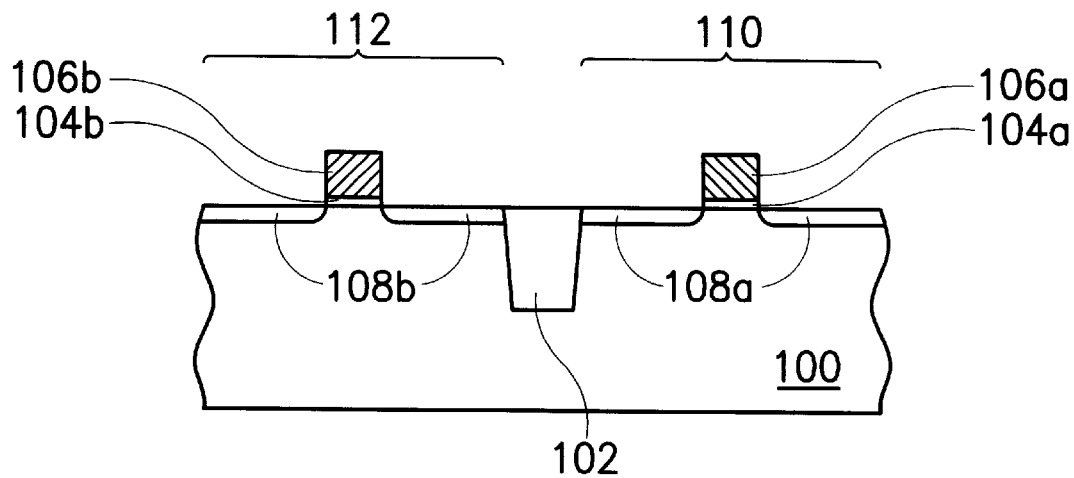
FIGS. 1 through 5 are schematic, cross-sectional views of the process for manufacturing a FET with a dual-spacer structure in a preferred embodiment according to the invention.

As shown in FIG. 1, a substrate 100 with a first device region 110 and a second device region 112 is provided. The first device region 110 is isolated from the second device region 112 by an isolation structure 102. The substrate 100 is made of silicon, for example. In the first device region 110, a first gate dielectric layer 104a is formed on the substrate 100 and a first gate 106a is formed on the first gate dielectric layer 104a. Similarly, in the second device region 112, a second gate dielectric layer 104b is formed on the substrate 100 and a second gate 106b is formed on the second gate dielectric layer 104b. The first gate dielectric layer 104a and the second gate dielectric layer 104b are formed from silicon oxide by thermal oxidation, for example. The first gate 106a and the second gate 106b are formed from doped polysilicon, metal silicide or doped polysilicon/silicide by chemical vapor deposition (CVD), for example.

Moreover, the first device region can be a P-type FET region or a high voltage device such as I/O region, for example. The second device region can be an N-type FET region or a low voltage device such as core region, for example.

A first lightly doped drain (LDD) region 108a and a second LDD region 108b are respectively formed at the first device region 110 and the second device region 112 in the substrate 100 by using the first gate 106a and the second gate 106b as mask layers. The first and the second LDD regions 108a and 108b are formed by implanting arsenic ions or phosphorus ions into the substrate 100 with a dosage of about 5E12–5E14 ions/cm$^2$ and under an energy of about 40–80 KeV, for example.

Figure 2:
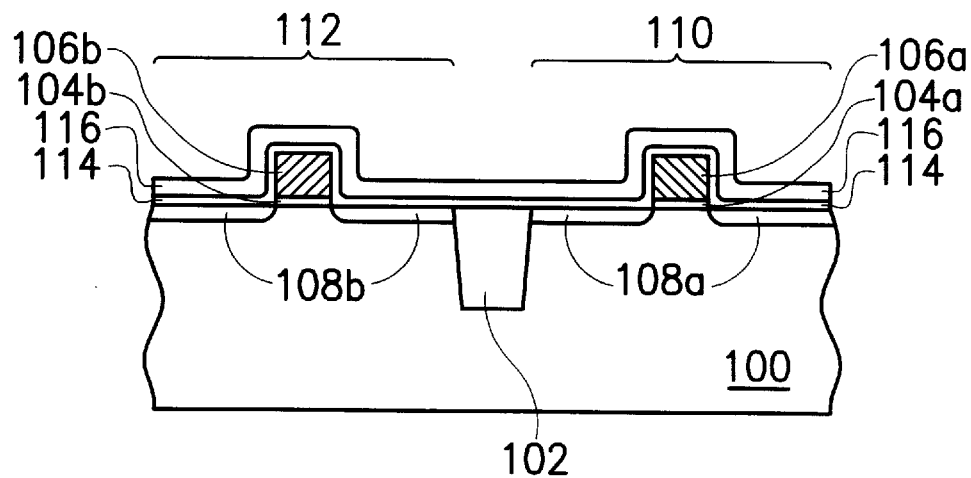

As shown in FIG. 2, a dielectric layer 114 is formed over the substrate 100. The dielectric layer 114 is formed from silicon oxide by CVD, for example. A dielectric layer 116 is formed on the dielectric layer 114. The dielectric layer 116 is made of silicon nitride, for example.

Figure 3:
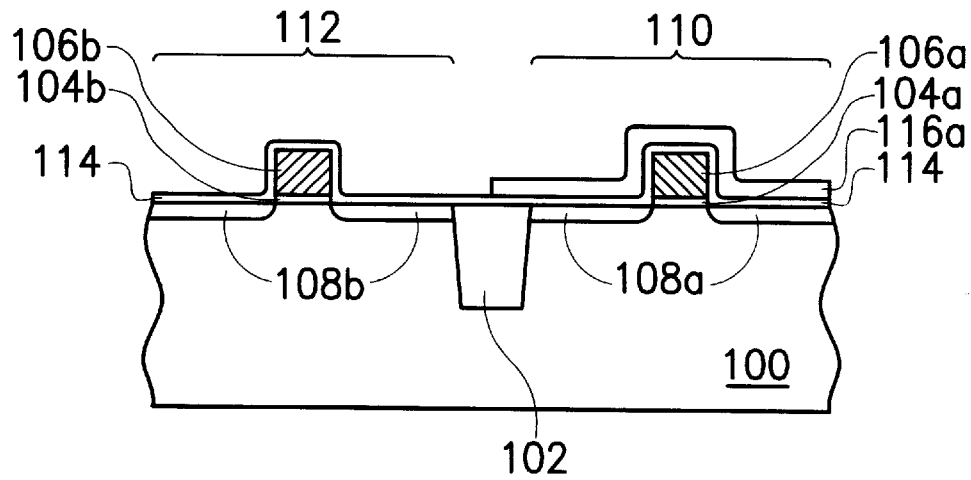

As shown in FIG. 3, a portion of the dielectric layer 116 in the second device region 112 is removed to expose a portion of the dielectric layer 114. The remaining dielectric layer 116 in the first device region 110 is denoted as dielectric layer 116a. The method for removing the portion of the dielectric layer 116 can be photolithography, for example. Preferably, the method for removing the portion of the dielectric layer 116 comprises dry etching or the wet etching, for example.

Figure 4:
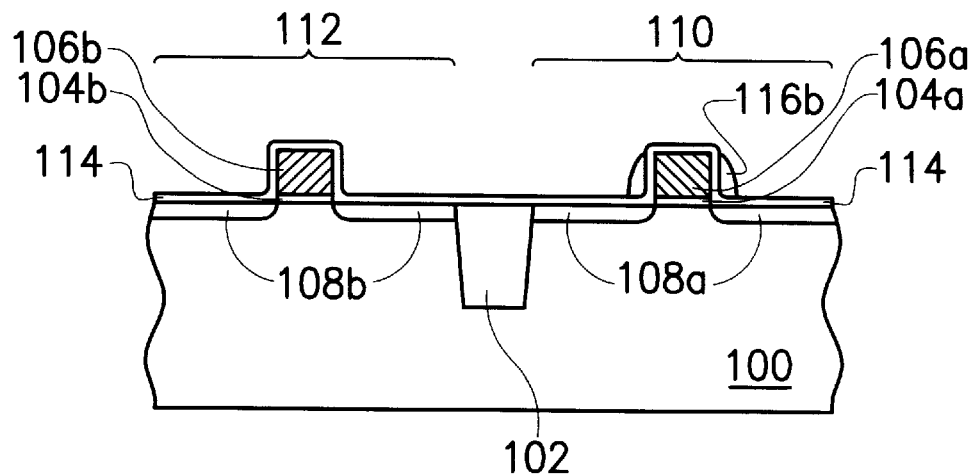

As shown in FIG. 4, a portion of the dielectric layer 116a in the first device region 110 to form a first spacer 116b on dielectric layer 114 located at the sidewall of the gate 106a and gate dielectric layer 104a. The method for removing the portion of the dielectric layer 116a is anisotropic etching, for example. The zenith of the first spacer 116b is at the same level as the top surface of the gate 106a.

Figure 5:
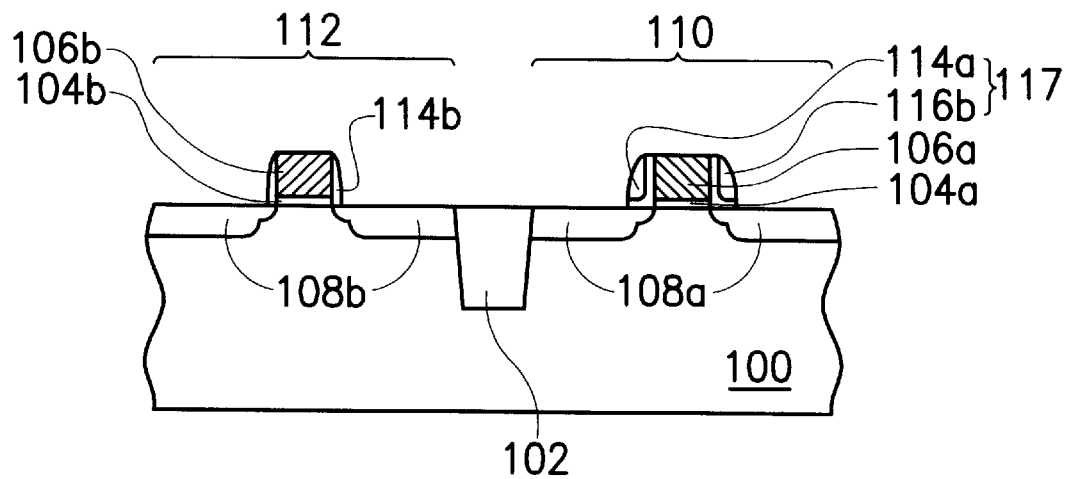

As shown in FIG. 5, a portion of the dielectric layer 114 is removed to form a second spacer 114b on the sidewall of the gate 106b and the gate dielectric layer 104b and to expose a portion of the substrate 100. A remaining dielectric layer 114a is left between the first spacer 116b and the first gate 106a. The remaining layer 114a and the first spacer 116b together form a third spacer 117. The method for removing the portion of the dielectric layer 114 is anisotropic etching, for example. Preferably, the anisotropic etching is performed with CF$_4$ plasma, for example.

An implantation process is performed to form a first source/drain region 118a and a second source/drain region 118b in the substrate exposed by the first gate 106a, the third spacer 117, the second gate 106b and the second spacer 114b.

Since the thickness of the third spacer 117 and the second spacer 114b can be adjusted by the diffusion rate of the implanted ions, the shape of the doped region after the anneal process can be well controlled. When the diffusion rate of the implanted ions is relatively fast, the spacer used as a mask in the implantation process is relatively thick so that the distance between the source/drain can be enlarged. Therefore, the shape of the source/drain with implanted ions possess relative fast diffusion rate can be well controlled and the short channel effect can be avoided. On the other hand, when the diffusion rate of the implanted ions is relatively slow, the spacer used as a mask in the implantation process is relatively thin so that the distance between the source/drain is relatively short. Hence, the source/drain with implanted ions possess relative slow diffusion rate can be well shaped.

According to the present invention, the problem caused by different diffusion rate of the different-type implanted ions can be solved by adjusting the thickness of the spacer. Therefore, the dopants with different diffusion rate can evenly diffuse in the substrate and the shape of the source/drain region can be well controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a field effect transistor with a dual-spacer structure, comprising the steps of:

providing a substrate having a first device region and a second device region, wherein the first device region comprises a first gate formed over the substrate and the second device region comprises a second gate formed over the substrate;

forming a first dielectric layer over the substrate;

forming a second dielectric layer on the first dielectric layer;

removing a portion of the second dielectric layer to expose a portion of the first dielectric layer in the second device region;

removing a portion of the remaining second dielectric layer to form a first spacer on the second dielectric layer on the sidewall of the first gate; and removing a portion of the first dielectric layer to form a second spacer on the sidewall of the second gate, wherein the first spacer and the remaining second dielectric layer between the first spacer and the first gate together form a third spacer.

2. The method of claim 1, wherein the first dielectric layer is made of silicon oxide.

3. The method of claim 1, wherein the second dielectric layer is made of silicon nitride.

4. The method of claim 1, wherein the first device region is a P-type field effect transistor region.

5. The method of claim 1, wherein a first voltage used in the first device region is higher than a second voltage used in the second region.

6. The method of claim 1, wherein the second device region is an N-type field effect transistor region.

7. The method of claim 1, wherein the step of removing the remaining portion of the second dielectric layer comprises an anisotropic etching process.

8. The method of claim 1, wherein the step of removing the first dielectric layer comprises an anisotropic etching process.

9. A method of manufacturing a field effect transistor with a dual-spacer structure, comprising the steps of:

providing a substrate having a plurality of gate formed thereon;

forming a first dielectric layer over the substrate;

forming a second dielectric layer on the first dielectric layer;

removing a portion of the second dielectric layer to expose a specific region of the first dielectric layer;

removing a portion of the remaining second dielectric layer to form a first spacer on the second dielectric layer on the sidewall of a portion of the gates in the specific region; and removing a portion of the first dielectric layer to form a second spacer on the sidewall of the gates excluding the gates with the first spacer, wherein the first spacer and the remaining second dielectric layer between the first spacer and the first gate together form a third spacer.

10. The method of claim 9, wherein the first dielectric layer is made of silicon oxide.

11. The method of claim 9, wherein the second dielectric layer is made of silicon nitride.

12. The method of claim 9, wherein the specific region is an N-type field effect transistor region.

13. The method of claim 9, wherein a first voltage used in the specific region is lower than a second voltage used in a region excluding the specific region.

14. The method of claim 9, wherein a region excluding the specific region is a P-type field effect transistor region.

15. The method of claim 9, wherein the step of forming the first spacer comprises an anisotropic etching process.

16. The method of claim 9, wherein the step of forming the second spacer comprises an anisotropic etching process.

* * * * *